United States Patent
Sakamoto et al.

(10) Patent No.: US 10,727,644 B2
(45) Date of Patent: Jul. 28, 2020

(54) LASER DEVICE

(71) Applicant: SHIMADZU CORPORATION, Nakagyo-Ku, Kyoto-Shi, Kyoto (JP)

(72) Inventors: Junki Sakamoto, Kyoto (JP); Ichiro Fukushi, Kyoto (JP); Akiyuki Kadoya, Kyoto (JP); Kazuma Watanabe, Kyoto (JP); Naoya Ishigaki, Kyoto (JP); Jiro Saikawa, Kyoto (JP); Shingo Uno, Kyoto (JP); Tomoyuki Hiroki, Kyoto (JP); Koji Tojo, Kyoto (JP)

(73) Assignee: SHIMADZU CORPORATION, Kyoto (JP)

( * ) Notice: Subject to any disclaimer, the term of this patent is extended or adjusted under 35 U.S.C. 154(b) by 422 days.

(21) Appl. No.: 15/539,719

(22) PCT Filed: Feb. 6, 2015

(86) PCT No.: PCT/JP2015/053381
§ 371 (c)(1),
(2) Date: Jun. 26, 2017

(87) PCT Pub. No.: WO2016/125301
PCT Pub. Date: Aug. 11, 2016

(65) Prior Publication Data
US 2018/0013263 A1    Jan. 11, 2018

(51) Int. Cl.
*H01S 5/024* (2006.01)
*H01S 5/40* (2006.01)
*G02B 6/42* (2006.01)
*B23K 26/342* (2014.01)
*H01S 5/022* (2006.01)

(52) U.S. Cl.
CPC ........ *H01S 5/02476* (2013.01); *B23K 26/342* (2015.10); *G02B 6/4206* (2013.01);
(Continued)

(58) Field of Classification Search
CPC ............ B23K 26/0604; B23K 26/0608; B23K 26/342; H01S 5/02476; H01S 5/02284;
(Continued)

(56) References Cited

U.S. PATENT DOCUMENTS

| | | | | |
|---|---|---|---|---|
| 5,886,313 A | * | 3/1999 | Krause | ................ B23K 26/034 219/121.6 |
| 6,222,864 B1 | * | 4/2001 | Waarts | .................. G02B 27/09 359/569 |

(Continued)

FOREIGN PATENT DOCUMENTS

| | | |
|---|---|---|
| CN | 1564404 | 1/2005 |
| JP | 2005-114977 | 4/2005 |

(Continued)

OTHER PUBLICATIONS

PCT/JP2015/053381, International Search Report and Written Opinion, dated Apr. 28, 2015, 2 pages—English, 7 page—Japanese.
(Continued)

*Primary Examiner* — Tu B Hoang
*Assistant Examiner* — Diallo I Duniver
(74) *Attorney, Agent, or Firm* — Andrew F. Young, Esq.; Lackenbach Siegel, LLP

(57) ABSTRACT

A laser device has a plurality of laser diodes; a plurality of optical elements installed corresponding to the plurality of the laser diodes; a plurality of units formed by fixing the laser diodes and the optical elements per each laser diode and installed corresponding to the plurality of the laser diodes; a converging element that converges laser beams emitted from the plurality of the laser diodes to a fiber; a housing element houses the plurality of the units and the converging element; and a thermal transfer plate performs heat dissipation of the plurality of the units. The heat resistance reducing element having a heat resistance value
(Continued)

that is smaller than a predetermined value is installed between the thermal transfer plate and each unit or the processing for reducing the heat resistance is performed.

6 Claims, 8 Drawing Sheets

(52) U.S. Cl.
CPC ........ G02B 6/4272 (2013.01); H01S 5/02284 (2013.01); H01S 5/02469 (2013.01); H01S 5/4012 (2013.01); H01S 5/4025 (2013.01)

(58) Field of Classification Search
CPC .. H01S 5/02469; H01S 5/4012; H01S 5/0261; H01S 5/02484; H01S 5/02492; H01S 5/02463; H01S 5/02453
USPC .............. 219/121.76, 121.6, 121.61, 121.62, 219/121.75, 121.73, 121.78, 121.79, 219/121.81, 121.83, 121.84, 76.1; 372/50.12, 50.121, 50.122, 50.23, 36
See application file for complete search history.

(56) References Cited

U.S. PATENT DOCUMENTS

| | | | | |
|---|---|---|---|---|
| 6,780,010 B2 * | 8/2004 | Cao | ...................... | A61C 19/004 362/800 |
| 6,975,659 B2 * | 12/2005 | Nagano | ................ | G02B 6/4206 372/36 |
| 7,068,690 B2 * | 6/2006 | Okazaki | ................ | H01S 5/4012 372/36 |
| 7,502,176 B2 | 3/2009 | Mino et al. | | |
| 2006/0274434 A1 | 12/2006 | Mino et al. | | |

FOREIGN PATENT DOCUMENTS

| | | |
|---|---|---|
| JP | 2005-311203 | 11/2005 |
| JP | 2006-301597 | 11/2006 |
| JP | 2007017925 | 1/2007 |
| JP | 2011-18800 | 1/2011 |
| JP | 2013-522893 | 6/2013 |
| JP | 2013-138086 | 7/2013 |
| JP | 2013-438086 | 7/2013 |
| JP | 2013196946 | 9/2013 |
| JP | 2014-17096 | 1/2014 |

OTHER PUBLICATIONS

PCT/JP2015/053381, International Preliminary Report on Patentability, Chaper 1, dated Aug. 6, 2017, 4 pages—Japanese, 2 pages—English.
CN 201580070860.5, Second Office Action dated Aug. 29, 2019, 6 pages—Japanese, 6 pages—English.

* cited by examiner

LASER DEVICE

CROSS REFERENCE TO RELATED APPLICATIONS

This application relates to, and claims priority as § 371 of SN.:PCT/JP2015/053381 filed Feb. 6, 2015, the entire contents of which are incorporated herein by reference.

FIGURE SELECTED FOR PUBLICATION

FIG. 2

BACKGROUND OF THE INVENTION

Field of the Invention

The present invention relates to a laser device applied to a laser machining device and laser illumination device.

Description of the Related Art

A laser device that bundles a plurality of laser beams emitted from laser diodes (LD) to achieve a high power is known. A laser device according to Patent Document 1 is designed for a projector that outputs a beam through a lens to project an image to a space. Optical components such as a laser diode and a lens are arranged based on machine accuracy.

When beams are converged to a fine spot, the beam having higher brightness (high-intensity) is needed. A method to achieve an output power by inputting the beams emitted from the plurality of laser diodes to the fiber and shaping the beams are known. For example, beams are input into a fiber having the core diameter Φ400 μm to achieve a high-power, a high accuracy in the optical system has not been required for the adjustment of the optical system.

When a high intensity laser beam feasible to irradiate a fine spot, however, is achieved, the area of the light source must be small under the constant light-intensity. Specifically, relative to a laser emitted from a fiber, if the fiber having a small core diameter is applied, a high intensity laser beam can be achieved. For such purpose, an adjustment technology for the optical components such as the laser diode and the lens to input the laser beam into the fiber having such small diameter.

Now, it is given the case in which the beam having high intensity and high-power is achieved by inputting a plurality of beams into the fiber having small diameter, e.g., Φ50-100 μm. In such case, when positioning is executed in a ballpark accuracy, the beams are too difficult to be input into the fiber. The beam incident into the cladding (jacket) material without input into the core transmits the cladding material and emits, so that quality of the beam can be detrimental and the transmission loss thereof can take place increasingly. In addition, the beam that is not incident even into the cladding material does not transmit through the fiber. The quality of the beam is detrimental and the connectivity becomes inefficient due to such maleffect and consequently, the loss thereof increases.

Further, the method of converging the beams into the core by collimating the beams emitted from the laser diodes is applied to input the plurality of beams into one fiber when the high-power beam is achieved. According to the above method, the laser diode and the collimate lens are assembled into one unit and subsequently, the location and the direction thereof are fine-tuned to guide the beams to the core. At this time, the beams can be incident into the core by fine-tuning the location of the unit following determining and fixing the location of the optical element for guiding to the core based on the machining accuracy.

In addition, heat dissipation of the laser diode is critically important to achieve such high-power laser beams. The temperature rise of the laser diode is detriment to the optical output and the lifetime thereof is shorter. Therefore, a thermal transfer plate having a high thermal conductivity is installed to the backside of the laser diode to enhance heat dissipation of the laser diode.

RELATED PRIOR ART DOCUMENTS

Patent Document

Patent Document 1: JP Patent Published 2013-196946
Patent Document 2: JP Patent Published 2007-17925

ASPECTS AND SUMMARY OF THE INVENTION

Objects to be Solved

When the location and the direction, however, are adjusted unit by unit, the back of each unit (opposite side of the light emission surface) is not perfectly parallel to the holder (holding member of the unit and convergent lens and fibers) and the plane of the thermal transfer (heat conductive and heat dissipation) plate intends to tilt more or less because of cumulating of a size tolerance, a geometric tolerance, the displacement of fiber and lens, an angular misalignment, a shear due to such as welding and so forth.

Consequently, a gap between the back of the unit and the thermal transfer plate is formed. Accordingly, the heat resistance increases because the contact area between each unit and the thermal transfer plate becomes smaller.

In addition, even when a measures such as inserting the thermal conduction insulation material to reduce the heat resistance under the condition in which cooling capability of the thermal transfer plate and a heat sink is satisfactory, a general thermal conduction insulation material has a higher heat resistance than a metal, so that heat dissipation from the laser diode cannot be sufficient. Thus, when the laser diode electricity increases, the electricity needed to achieve the predetermined optical output power increases because the temperature rises compared to the time when the heat resistance is small. Consequently, decrease of the efficiency due to the increase of electricity is much bigger compared to when the heat resistance is small, so that an expected output power cannot be achieved.

In addition, when the number of the laser diode is increased to achieve a high-power output beam and much more laser diode beams are bundled, the occurrence rate of the displacement and the degree of displacement become bigger in proportion of the number of the laser diodes, so that heat resistance can further increase.

The present invention relates to provide a laser diode device that can prevent temperature rise and decrease of efficiency by increasing the contact area between each unit and the thermal transfer plate even when an electricity of the laser diode is increased.

Means for Solving the Problem

For solving the above problem, a laser device comprises; a plurality of laser diodes; a plurality of optical elements installed corresponding to the plurality of the laser diodes; a plurality of units that is formed by fixing the laser diodes and the optical elements per each laser diode and installed corresponding to the plurality of the laser diodes; a converging element that converges laser beams emitted from the plurality of the laser diodes to a fiber; a housing element that houses the plurality of the units and the converging element; and a heat dissipation element that performs heat dissipation of the plurality of the units; wherein a heat resistance reducing element having a heat resistance value that is smaller than a predetermined value is installed between the heat dissipation element and each unit or the process for reducing the heat resistance is performed.

Effect of the Invention

According to the present invention, the heat resistance reducing element having the heat resistance value that is smaller than the predetermined value is installed between the thermal transfer plate and each unit or the process for reducing the heat resistance is performed, so that the contact area between the thermal transfer plate and each unit can be increased. Therefore, the laser diode device that can prevent temperature rise and decrease of efficiency when an electricity of the laser diode is increased can be provided.

The above and other aspects, features and advantages of the present invention will become apparent from the following description read in conjunction with the accompanying drawings, in which like reference numerals designate the same elements.

DETAILED DESCRIPTION OF THE PREFERRED EMBODIMENTS

Figure 1:
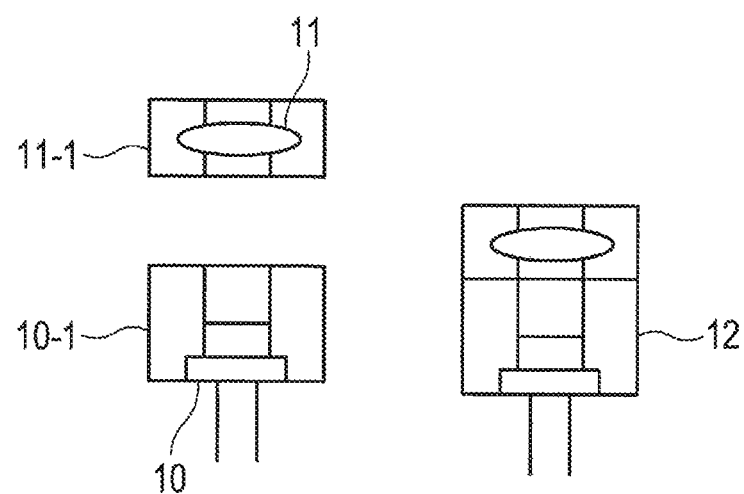
FIG. 1 is a schematic diagram illustrating a unit comprising a collimate lens and a LD holder relative to a laser device according to the aspect of the Embodiment of the present invention.

Reference will now be made in detail to embodiments of the invention. Wherever possible, same or similar reference numerals are used in the drawings and the description to refer to the same or like parts or steps. The drawings are in simplified form and are not to precise scale. The word 'couple' and similar terms do not necessarily denote direct and immediate connections, but also include connections through intermediate elements or devices. For purposes of convenience and clarity only, directional (up/down, etc.) or motional (forward/back, etc.) terms may be used with respect to the drawings. These and similar directional terms should not be construed to limit the scope in any manner. It will also be understood that other embodiments may be utilized without departing from the scope of the present invention, and that the detailed description is not to be taken in a limiting sense, and that elements may be differently positioned, or otherwise noted as in the appended claims without requirements of the written description being required thereto.

Various operations may be described as multiple discrete operations in turn, in a manner that may be helpful in understanding embodiments of the present invention; however, the order of description should not be construed to imply that these operations are order dependent.

Figure 2:
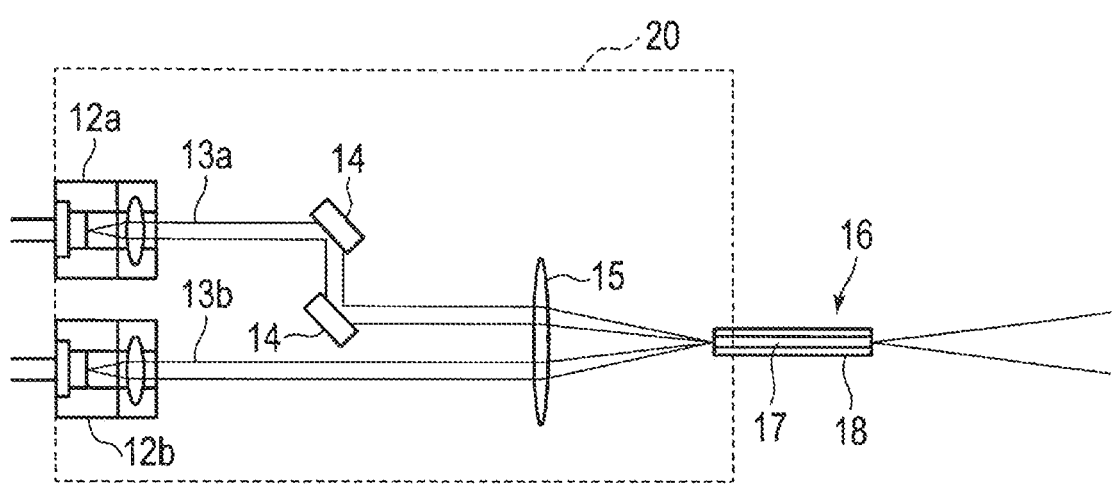
FIG. 2 is a schematic diagram illustrating an optical system of the laser device having a plurality of laser diodes according to the aspect of the Embodiment of the present invention.
Figure 3:
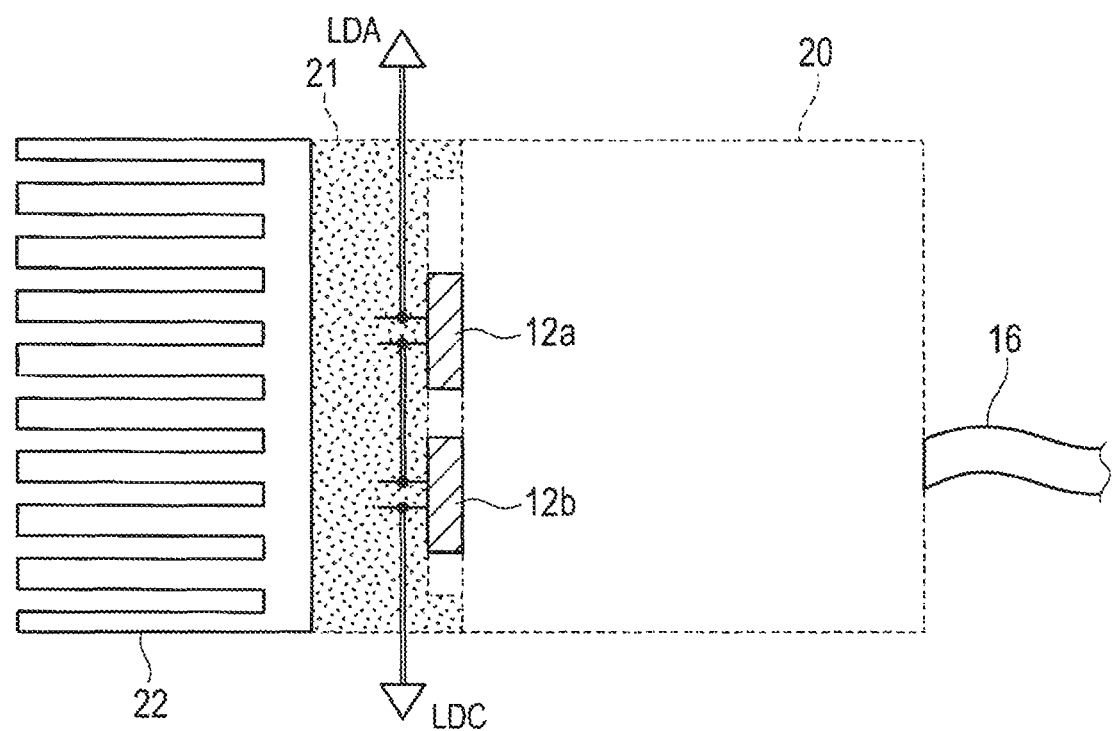
FIG. 3 is a schematic diagram illustrating the entire laser device according to the aspect of the Embodiment of the present invention.

Hereinafter, referring to FIGs., the inventor sets forth further detail of a laser device according to the aspect of the Embodiment of the present invention. FIG. 1 is a schematic diagram illustrating a unit comprising a collimate lens holder 11-1 and a LD holder 10-1 relative to a laser device according to the aspect of the Embodiment of the present invention. FIG. 2 is a schematic diagram illustrating the laser device having a plurality of laser diodes 10 according to the aspect of the Embodiment of the present invention. FIG. 3 is a schematic diagram illustrating the entire laser device according to the aspect of the Embodiment of the present invention.

The laser device comprises: the plurality of laser diodes 10; a plurality of collimate lenses 11 (optical elements of the present invention) installed corresponding to the plurality of the laser diodes 10; a plurality of units 12 that is formed by fixing the laser diodes 10 and the collimate lenses 11 wherein the collimate lenses are installed corresponding to each of the plurality of laser diodes 10 as shown in FIG. 1; a converging lens 15 (corresponding to a converging element of the present invention) that converges laser beams emitted from the plurality of the laser diodes 10 to a fiber 16; a holder 20 (corresponding to the house of the present invention) housing the plurality of the units 12 and the converging lens 15; and a thermal transfer plate 21 (corresponding to the heat dissipation element of the present invention) that performs heat dissipation of the plurality of the units 12.

Referring to FIG. 1, the laser diode 10 is fixed to the LD holder 10-1 and the collimate lens 11 is fixed to the collimate lens holder 11-1. The unit 12 is formed by welding and fixing the LD holder 10-1 and the collimate lens holder 11-1 while confirming that the collimated beam can be emitted in the predetermined acceptable range from the LD holder 10-1 and the collimate lens holder 11-1. The plurality of the units 12 are manufactured by repeating the above process.

Referring to FIG. 2, units 12 are two in the Embodiment. The number of units 12 are not limited to two and can be three or more. Referring to FIG. 2, the units 12a, 12b are in-place and distant in the predetermined distance to each other and housed and fixed in the holder 20. The holder 20 houses additionally two mirrors 14 and the converging lens 15. In addition, the core 17 facing to the converging lens 15 and the fiber 16 comprising the cladding element 18 and the fiber 16 outside of the holder 20.

Referring to FIG. 2, the traveling direction of the beam 13 emitted from the units 12a is controlled by the mirror 14 and the beam 13a travels to the converging lens 15 as is going to connect the core 17 of the fiber 16. The locations of the units 12a, 12b are adjusted so that the beam from the unit 12a and the beam from unit 12b are converged by the converging lens 15 to connect to the core 17 and the space between the respective units 12a, 12b and the holder 20 are welded using the laser to fix each other.

Referring to FIG. 3, the units 12 are in-place in contact with the one surface of the thermal transfer plate 21 a heat sink 22 having a pleated structure is in-place in contact with the other surface of the thermal transfer plate 21. As shown in FIG. 3, LDA (laser diode anode) refers to the anode grounded polarity for the laser diode and LDC (laser diode cathode) refers to the cathode grounded polarity of the laser diode.

First, the inventor sets forth the case when the locational relationship between the units 12 and the holder 20 is ideal. Referring to FIG. 3, when the contact area between the units 12 and the thermal transfer plate 21 is large, the thermal resistance is small. Cables of the laser diodes 10 are wired to the thermal transfer plate 21 and wiring is in-place as the contact area between the units 12 and the thermal transfer plate 21 does not decrease. The heat generated at the units 12a, 12b transmits to the heat sink 22 via the thermal transfer plate 21 and is dissipated through the heat sink 22.

Accordingly, the temperature rise of the entire laser system can be suppressed. A small gap between the units 12 and the thermal transfer plate 21 may be formed in case. The thermal conductive sheet such as indium or a silicon grease, however, is inserted so that the thermal resistance can be decreased.

Next, when the locational relationship between the units 12 and the holder 20 is shifted, a gap is generated because the shortest distance between the unit 12a and the holder 20 and the shortest distance between the unit 12b and the holder 20 become the same. At this time, the thermal resistance increases because the contact area between the units 12 and the thermal transfer plate 21 becomes smaller.

Hereafter, the inventor sets forth a few Embodiments in which a thermal resistance reducing element having the smaller thermal resistance value than the predetermined value is installed between the units 12 and the thermal transfer plate 21 or the thermal resistance value is made smaller by increasing the contact area by performing the thermal resistance reducing process.

Embodiment 1

Figure 4A:
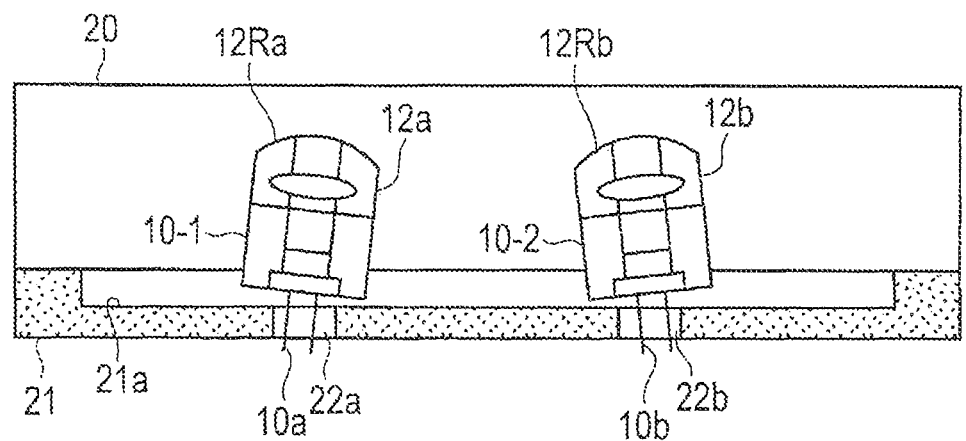
FIG. 4 is a schematic diagram illustrating the laser device according to the aspect of the Embodiment 1 of the present invention.
Figure 4B:
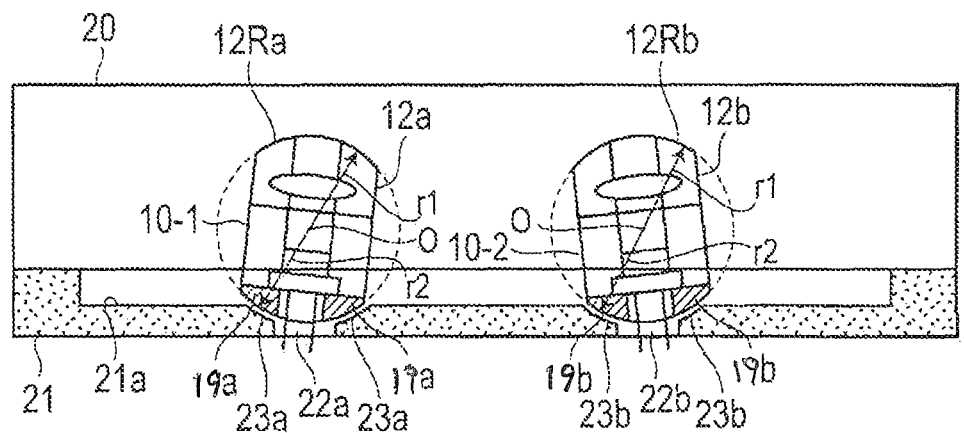

FIG. 4A, 4B are schematic diagrams illustrating the laser device according to the aspect of the Embodiment 1 of the present invention. FIG. 4A is a schematic diagram illustrating the magnified partial structure of the laser device without (before) installation of the thermal resistance reducing element, and FIG. 4B is a schematic diagram illustrating the magnified partial structure of the laser device with (after) completed installation of a spherical crown comprising the thermal resistance reducing element.

Referring to FIG. 4A, the thermal transfer plate comprises a concave 21a and holes 22a, 22b and the thermal transfer plate 21 is fixed in contact with the holder 20. Units 12a, 12b comprising laser diode holders 10-1, 10-2 and the collimate lens holders 11-1, 11-2, which are fixed by welding together, are installed to the holder 20. Pins 10a, 10b of the respective laser diodes 10 are inserted into the holes 22a, 22b. The units 12a, 12b tilt against the thermal transfer plate 21 and a gap is formed between the units 12a, 12b and the thermal transfer plate 21. In addition, sphere (spherical surface) 12Ra, 12Rb having curvature radius r1 are formed at the tip (top end) of units 12a, 12b.

Next, referring to FIG. 4B, the spherical crowns 19a, 19b comprising the element having a smaller thermal resistance value than the predetermined value (material having a small thermal resistance value) are formed at the opposite end of the light emission direction of the units 12a, 12b. The spherical crowns 19a, 19b are a sphere having a curvature radius r2. In addition, the curvature center location O of the sphere 12Ra, 12Rb coincides with the curvature center location of the spherical crowns 19a, 19b. In addition, spherical concaves 23a, 23b having the spherical center location that coincides with the curvature center location O are formed at the thermal transfer plate 21.

The spatial height of the thermal transfer plate 21 is determined in advance so that the length between the tip of the units 12 and the top of the spherical crowns 19a, 19b equals to r1+r2.

According to the above configuration, the sum of the curvature radii of the sphere 12Ra, 12Rb, the spherical crowns 19a, 19b and the spherical concaves 23a, 23b is r1+r2 and the length between the tip of the units 12a, 12b and the spherical crowns 19a, 19b is r1+r2, so that both spherical centers coincide each other. Therefore, even if the units 12 tilt against the thermal transfer plate 21, the units 12a, 12b, the spherical crowns 19a, 19b and the thermal transfer plate 21 contact to each other with the maximum contact area regardless the tilt of the units 12a, 12b. Accordingly, the thermal resistance decreases compared to when the thermal transmittal material is inserted. Consequently, the laser diode device can prevent temperature rise and decrease of efficiency when an electricity of the laser diode is increased.

In addition, the tip of the units 12a, 12b is a convex element having a certain curvature and the recipient side of the holder 20 is a concave element having a certain curvature, so that the locational alignment of the units 12a, 12b can be facilitated.

Embodiment 2

Figure 5A:
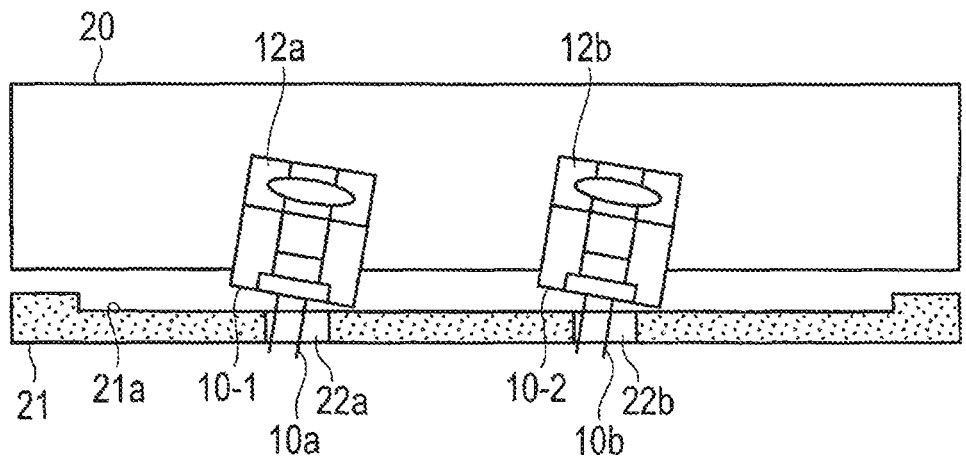
FIG. 5 is a schematic diagram illustrating the laser device according to the aspect of the Embodiment 2 of the present invention.
Figure 5B:
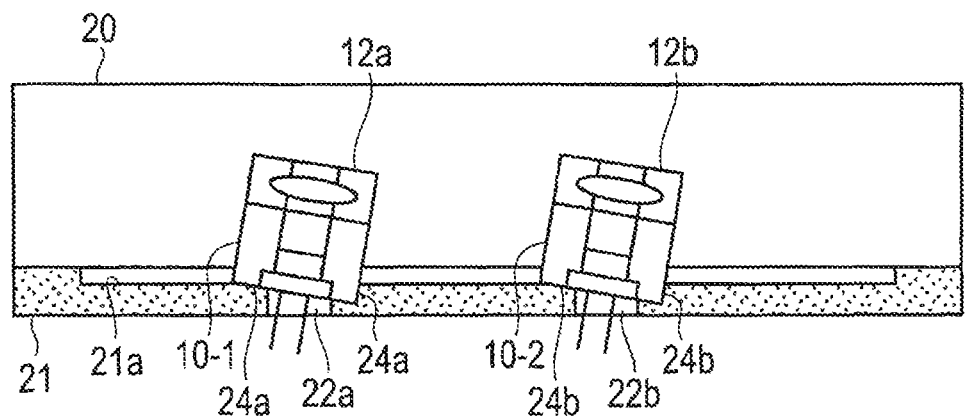

FIG. 5A, 5B are schematic diagrams illustrating the laser device according to the aspect of the Embodiment 2 of the present invention. FIG. 5A is a schematic diagram illustrating before the thermal resistance reducing processing is performed, and FIG. 5B is a schematic diagram illustrating after the thermal resistance reducing processing was performed.

Referring to FIG. 5A, the units 12a, 12b tilt against the thermal transfer plate 21 and a gap is formed between the units 12a, 12b and the thermal transfer plate 21.

Referring to FIG. 5B, after the units 12a, 12b are fixed to the holder 20 by welding, the height data relative to the back (opposite surface of the light emission side) thereof are obtained from the three-dimensional location data (x, y, z) by utilizing such as a three-dimensional height measurement device and so forth.

Subsequently, the thermal transfer plate 21 is subject to cutting work to form the cuts 24a, 24b based on the location data of the height z. The bottom end of the units 12a, 12b are in contact with such cuts 24a, 24b. Consequently, the contact area between each unit 12a, 12b and the thermal transfer plate 21 can be increased. When the cutting is performed as the insert angle of the cutting tool is perpendicular to the back of each unit 12a, 12b, the efficiency can be improved because the undersurface (back) is formed to be flat.

In addition, when the cutting work is performed, the workability increases if the NC (numerical control) machining is applied. In addition, the NC machining needs the three-dimensional location data are needed, so that compatibility with the present Embodiment can be high.

In addition, according to the aspect of the Embodiment 2, the thermal transfer plate 21 is subject to the NC machining, but each unit 12a, 12b instead of the thermal transfer plate 21 can be subject to the NC machining.

Embodiment 3

Figure 6:
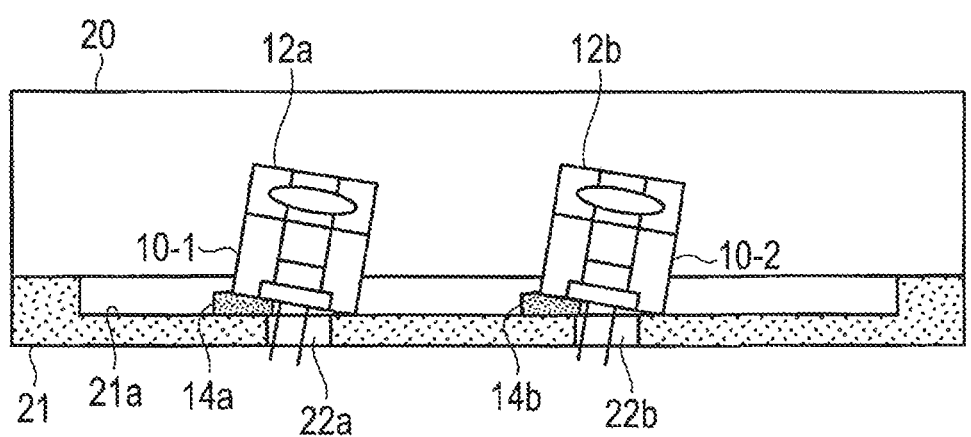
FIG. 6 is a schematic diagram illustrating the laser device according to the aspect of the Embodiment 3 of the present invention.

FIG. 6 is a schematic diagram illustrating the laser device according to the aspect of the Embodiment 3 of the present invention. After the units 12a, 12b are fixed to the holder 20 by welding, the height data relative to the back (opposite surface of the light emission side) thereof are obtained from the three-dimensional location data (x, y, z) by utilizing such as a three-dimensional height measurement device and so forth.

Subsequently, metals 14a, 14b are layered on the thermal transfer plate 21 using a three-dimensional printer based on the locational data of the height z. Consequently, the contact area between each unit 12a, 12b and the thermal transfer plate 21 can be increased. The metal used for layering has an equivalent thermal resistance to the thermal transfer plate 21 and is made of metal material that can be strongly connected thereto. The thermal transfer plate 21 is made of the metal material, e.g., copper and aluminum, having a high thermal conductivity.

In addition, according to the aspect of the Embodiment 3, the thermal transfer plate 21 is subject to the layer forming work, but each unit 12a, 12b instead of the thermal transfer plate 21 can be subject to the layer forming work.

Embodiment 4

Figure 7A:
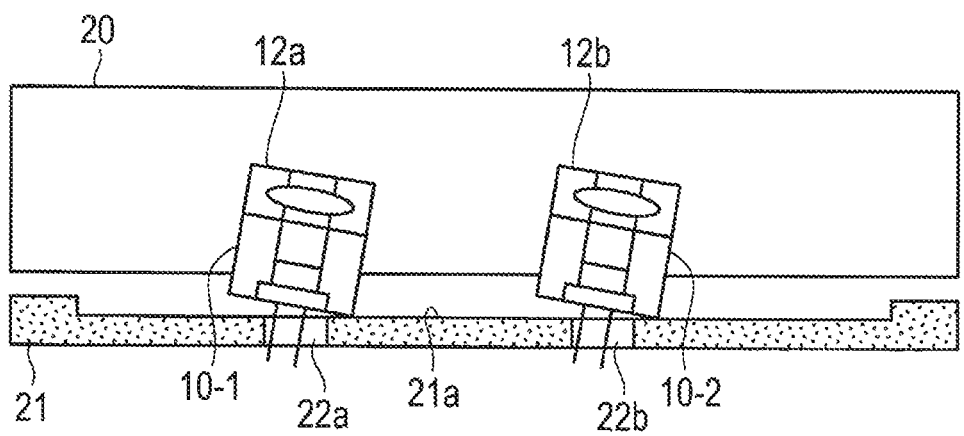
FIG. 7 is a schematic diagram illustrating the laser device according to the aspect of the Embodiment 4 of the present invention.
Figure 7B:
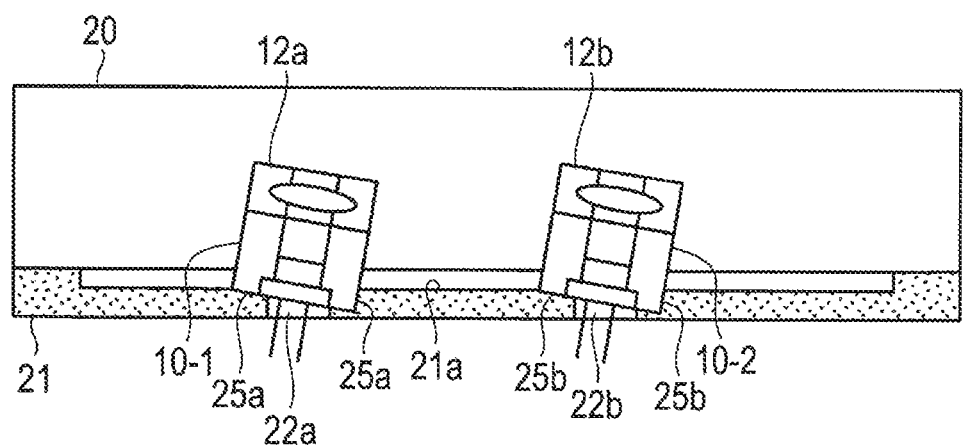

FIG. 7A, 7B are schematic diagrams illustrating the laser device according to the aspect of the Embodiment 4 of the present invention. FIG. 7A is a schematic diagram illustrating before the thermal resistance reducing processing is performed, and FIG. 7B is a schematic diagram illustrating after the thermal resistance reducing processing was performed.

After the units 12a, 12b are fixed to the holder 20 by welding, the height data relative to the back (opposite surface of the light emission side) thereof are obtained from the three-dimensional location data (x, y, z) by utilizing such as a three-dimensional height measurement device and so forth.

Subsequently, the thermal transfer plate 21 is subject to ablation machining using a laser machining device based on the locational data of the height z. The ablation machining is a laser machining in which pulse lasers are irradiated to the thermal transfer plate 21 to remove the structural solid material.

The ablation machined element 25a, 25b are formed on the thermal transfer plate 21 by the ablation machining. Consequently, the contact area between each unit 12a, 12b and the thermal transfer plate 21 can be increased because the back of the units 12a, 12b are in contact with the ablation machined element 25a, 25b.

In addition, according to the aspect of the Embodiment 4, the thermal transfer plate 21 is subject to the ablation machining, but each unit 12a, 12b instead of the thermal transfer plate 21 can be subject to the ablation machining.

Embodiment 5

Figure 8:
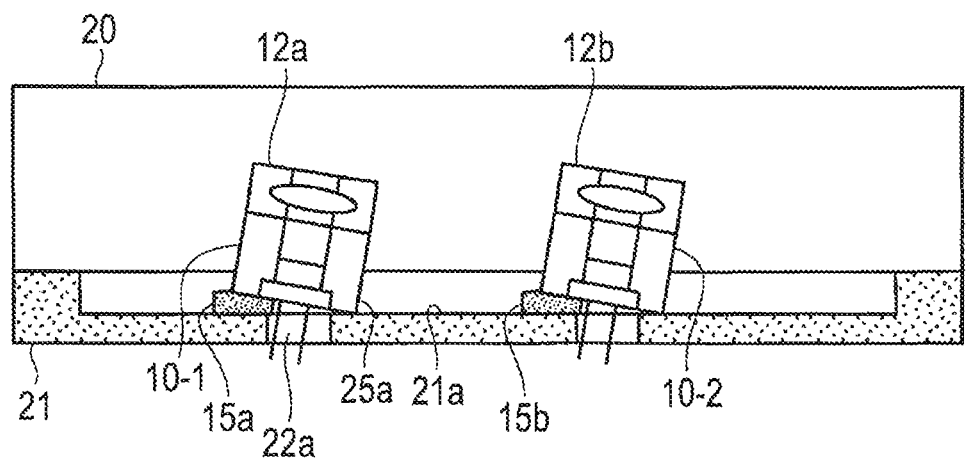
FIG. 8 is a schematic diagram illustrating the laser device according to the aspect of the Embodiment 5 of the present invention.

FIG. 8 is a schematic diagram illustrating the laser device according to the aspect of the Embodiment 5 of the present invention. Referring to FIG. 8, the units 12a, 12b are fixed to the holder 20 by welding. A fine groove is installed to the contact surface with the thermal transfer plate 21 in advance. The groove that is a structure for improving the solder flow due to a phenomenon of capillary action of the V-shaped groove can enhance wettability and adhesivity of the solders 15a, 15b to the thermal transfer plate 21.

The solders 15a, 15b are pasted on the entire surface of the thermal transfer plate 21 or the surface in the contact range with each unit 12a, 12b. The solders 15a, 15b can smoothly flow between the thermal transfer plate 21 and the units 12a, 12b due to forming the groove.

The thermal transfer plate 21 and each unit 12a, 12b are soldered by contacting and heating the thermal transfer plate 21 and each unit 12a, 12b with the solders 15a, 15b. Consequently, the contact area between each unit 12a, 12b and the thermal transfer plate 21 can be increased.

At this time, the laser diodes 10 are preferably and selectively cooled to keep the temperature of the laser diodes 10 in each unit 12a, 12b below the absolute maximum specified temperature (e.g., 80° C.). In addition, if the low-melting point solder and so forth is used as the solder 15a, 15b, the process can be simplified.

INDUSTRIAL APPLICABILITY

The present invention is applicable to a laser machining device, a high-power laser device for such as a laser illumination.

Also, the inventors intend that only those claims which use the words "means for" are intended to be interpreted under 35 USC 112, sixth paragraph. Moreover, no limitations from the specification are intended to be read into any claims, unless those limitations are expressly included in the claims.

Having described at least one of the preferred embodiments of the present invention with reference to the accompanying drawings, it will be apparent to those skills that the invention is not limited to those precise embodiments, and that various modifications and variations can be made in the presently disclosed system without departing from the scope or spirit of the invention. Thus, it is intended that the present disclosure cover modifications and variations of this disclosure provided they come within the scope of the appended claims and their equivalents.

What is claimed is:

1. A laser device, comprising:
a plurality of laser diodes;
a plurality of laser diode holders, each of the plurality of laser diode holders housing each one of the plurality of laser diodes;
a plurality of optical elements installed corresponding to the plurality of the laser diodes;
a plurality of optical element holders, each of the plurality of optical elements being within each one of the plurality of optical element holders;
a plurality of units that are formed by fixing respectfully at least one of the plurality of optical elements per each respective laser diode;
a converging element that converges laser beams emitted from said plurality of the laser diodes to a fiber;
a housing element that houses said plurality of the units and said converging element; and a thermal transfer plate that performs heat dissipation of said plurality of units, said thermal transfer plate being in fixed contact with at least one of the plurality of laser diode holders, said plurality of laser diodes being electrically coupled to said thermal transfer plate by electrical wiring, said electrical wiring being in place as a contact area between said plurality of units and said thermal transfer plate;

wherein said laser device further comprises:
- at least one thermal resistance reducing element being disposed against a surface of each of said plurality of laser diode holders and having a low thermal resistance value, and is operative for a thermal resistance reducing processing for reducing thermal resistance, between said thermal transfer plate and each said unit; and wherein:
  - said thermal resistance reducing element further comprises:
    - a spherical crown that is formed at an opposite side of the light emission direction of each unit and has a curvature center location coinciding with a curvature center location of each unit;
    - wherein a spherical concave having a curvature center location coinciding with said curvature center location of each unit is formed in said thermal transfer plate; and
    - wherein said spherical crown and said thermal transfer plate contact to each other regardless of a tilt of each of the plurality of units.

2. The laser device according to claim 1, wherein:
said thermal resistance reducing processing is a cutting work processing for at least said thermal transfer plate and each unit.

3. The laser device according to claim 1, wherein:
said thermal resistance reducing processing is an addition machining processing using layer forming technology on at least said thermal transfer plate and each unit.

4. The laser device according to claim 1, wherein:
said thermal resistance reducing processing is an ablation processing for at least said thermal transfer plate and each unit.

5. The laser device according to claim 1, wherein:
said thermal resistance reducing element comprises a solder that solders between the said thermal transfer plate and each unit.

6. The laser device according to claim 1, further comprising:
a cooling element for performing at least one of natural-cooling and forced-cooling of unit.

* * * * *